United States Patent
Sugerman et al.

(10) Patent No.: US 6,646,840 B1
(45) Date of Patent: Nov. 11, 2003

(54) INTERNALLY TRIGGERED ELECTROSTATIC DEVICE CLAMP WITH STAND-OFF VOLTAGE

(75) Inventors: Alvin Sugerman, Scarborough, ME (US); Raymond Roberts, Saco, ME (US); Michael Harley-Stead, Portland, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 234 days.

(21) Appl. No.: 09/630,946

(22) Filed: Aug. 3, 2000

(51) Int. Cl.$^7$ ................................................. H02H 9/04
(52) U.S. Cl. ................................................................ 361/56
(58) Field of Search ........................ 257/23, 360; 361/56

(56) References Cited

U.S. PATENT DOCUMENTS

| | | | |
|---|---|---|---|
| 4,101,922 A | * 7/1978 | Tihanyi et al. | 357/23 |
| 5,237,395 A | 8/1993 | Lee | |
| 5,276,346 A | * 1/1994 | Iwai et al. | 257/360 |
| 5,311,391 A | 5/1994 | Dungan et al. | |
| 5,386,135 A | * 1/1995 | Nakazato et al. | 257/369 |
| 5,400,202 A | 3/1995 | Metz et al. | |
| 5,450,267 A | 9/1995 | Diaz et al. | |
| 5,521,789 A | 5/1996 | Ohannes et al. | |
| 5,528,188 A | 6/1996 | Au et al. | |
| 5,565,790 A | 10/1996 | Lee | |
| 5,579,200 A | * 11/1996 | Rajkanan et al. | 361/111 |
| 5,594,204 A | * 1/1997 | Taylor et al. | 174/52.2 |
| 5,602,046 A | * 2/1997 | Calafut et al. | 437/41 |
| 5,615,073 A | * 3/1997 | Fried et al. | 361/56 |
| 5,617,283 A | * 4/1997 | Krauker et al. | 361/56 |
| 5,742,084 A | 4/1998 | Yu | |
| 5,784,242 A | 7/1998 | Watt | |
| 5,852,541 A | 12/1998 | Lin et al. | |
| 5,870,268 A | 2/1999 | Lin et al. | |
| 5,917,336 A | 6/1999 | Smith et al. | |
| 5,946,177 A | 8/1999 | Miller et al. | |
| 5,949,634 A | 9/1999 | Yu | |
| 5,978,192 A | * 11/1999 | Young et al. | 361/56 |
| 5,982,217 A | 11/1999 | Chen et al. | |
| 5,982,600 A | 11/1999 | Cheng | |
| 6,040,603 A | * 3/2000 | Yang | 257/344 |
| 6,043,967 A | 3/2000 | Lin | |
| 6,069,782 A | * 5/2000 | Lien et al. | 361/111 |
| 6,072,219 A | * 6/2000 | Ker et al. | 257/355 |
| 6,091,592 A | * 7/2000 | Sakurai | 361/56 |
| 6,204,537 B1 | * 3/2001 | Ma | 257/360 |

OTHER PUBLICATIONS

Stanley Wolf, Silicon Processing for the VLSI ERA, v.2, Lattice Press, 1990, pp. 89–91, 581–583.*

* cited by examiner

Primary Examiner—Gregory J. Toatley, Jr.
Assistant Examiner—Zeev Kitov
(74) Attorney, Agent, or Firm—Cesari and McKenna, LLP; Edwin H. Paul, Esq.

(57) ABSTRACT

An ESD protection device including a compound transistor structure having a trigger transistor and an ESD protection transistor. The trigger transistor includes a breakdown potential between the standoff voltage of a circuit to be protected and the breakdown potential of the ESD protection transistor. When activated, the trigger transistor operates to turn on the ESD protection transistor that is designed to carry the bulk of the conduction current associated with an ESD event. The trigger transistor is designed with an internal gain mechanism to ensure that it will not be turned off when a modified snapback voltage is reached during the ESD protection transistor operation. The trigger transistor is a minor contributor to the conducting current with the ESD protection transistor after such time as protection circuit operation acts. A process for fabricating a suitable compound transistor structure is disclosed.

11 Claims, 2 Drawing Sheets

INTERNALLY TRIGGERED ELECTROSTATIC DEVICE CLAMP WITH STAND-OFF VOLTAGE

BACKGROUND OF THE INVENTION

1. Field of the Invention

The present invention relates to Electrostatic Discharge Protection (ESDP) devices. In particular, the present invention relates to triggering mechanisms for activating metal-oxide-silicon (MOS) transistors or bipolar transistors used as ESDP structures.

2. Description of the Prior Art

The fabrication of increasingly smaller integrated circuit (IC) devices has made the reliance upon effective smaller ESDP devices more important. It is well known that transient voltage surges, referred to as electrostatic discharges that may be thousands of volts, commonly occur at the terminals of IC's. These terminals are electrically coupled to active circuit components including, but not limited to, bipolar and MOS transistors. It is important to block ESD events or to divert ESD events away from the gates of transistors, particularly those transistors acting as circuit buffers, in order to ensure that the transistors are not destroyed or otherwise compromised. When that occurs, operation of the circuit can be adversely affected, including the possibility of system failure.

As ESD problems are widespread, wide arrays of solutions have been developed. For the most part, these solutions have involved the placement of low-breakdown transistors or diodes in parallel with the circuit to be protected. The transistor or diode is designed to be non-conducting under expected potential values, and conducting when a potential on an input or output buffer node exceeds those expected values. When turned on by the higher-than-expected potential, the ESD device is designed to divert inordinately high current associated with such transient conditions away from the circuit to which the ESD device is connected. Commonly, it is desirable to have the transient current diverted to a low-potential power rail, generally defined as ground. N-type MOS (NMOS) ESDP transistors are often used to achieve that end.

More recently, pluralities of NMOS transistors have been employed in parallel combination to provide protection. However, it is important in such a configuration to make sure that each of the individual transistors making up the composite transistor turns on at substantially the same time. Failure to do so will result in the first of the transistors in the set to turn on to support the entire transient load. That generally causes failure of that transistor unit as well as the entire ESD protection device. Ballast resistance is required in these devices as a means to alleviate problems of non-simultaneous turn-on; however, the ballast that is often required can lead to unacceptable increases in transistor set size. Variations occurring during processing of the prior ballasted ESD devices further tend to yield unreliable ESD protection, particularly where vertical pathways and field oxides were relied upon to provide the resistance. It is well known that such pathways can vary substantially in resistance from one site to another.

One particular ESDP device includes a MOS transistor having its gate coupled to a triggering mechanism. Like the MOS transistor, the trigger is coupled in parallel to the circuit to be protected. The transistor and trigger are designed to operate as follows. The transistor is configured to conduct relatively high currents of the type that may be expected under typical electrostatic conditions, such as those currents associated with human body model spikes. The transistor is also configured to clamp across itself a potential that keeps the circuit to be protected unharmed. A generic representation of the trigger-based ESDP device is shown in FIG. 1. The protected circuit 10 exists between supply pads 20 and 30. An ESD transistor M1 that is typically an N-type MOS transistor, is coupled in parallel with the circuit 10. Finally, a trigger 40 coupled in parallel with the circuit 10 has an output coupled to the gate of M1.

In intended operation, the trigger 40 activates at a desired standoff voltage. The transistor action of transistor M1 thereby clamps the potential applied to circuit 10, preferably at a level and in time to ensure that circuit 10 will not be damaged by the overvoltage event. Ideally, the trigger 40 does not interfere with the standard operation of the circuit 10 when there is no discharge event. It should not turn on too slowly in relation to the discharge event and it should not interfere with the operation of the primary ESD transistor M1. Preferably, the trigger 40 consumes little space on a die and does not cause premature degradation of the entire circuit structure.

Common prior ESDP devices are shown in FIGS. 2 and 3, each of which includes the NMOS primary ESD transistor M1 coupled in parallel with the circuit 10 to be protected. The device of FIG. 2 includes as the trigger an RC gate pump branch formed of a capacitor C1 in series with a resistor R1. The high-potential node of resistor R1 is connected to the gate of M1. The RC branch activates the ESDP transistor M1 by pumping up the potential of its gate to a value beyond the threshold potential. The RC branch effectively lowers the trigger potential of that transistor, and can do so uniformly for a plurality of ESDP transistor elements. That is, transistor M1 turns on before the potential at either of the pads 20 and 30 exceeds a value dangerous for the circuit 10. The transistor M1 thereby diverts current from one pad to the other before damage occurs.

That is the ideal operation of the ESDP device of FIG. 2. However, there are disadvantages associated with the RC branch trigger design. First, as circuits become increasingly smaller and preferably increasingly faster, it is generally undesirable to insert capacitance of the magnitude required for a suitable ESDP device. Second, the additional capacitance may create a pad-to-pad leakage pathway resulting in performance loss, particularly under rapid signal transition conditions. Finally, dependent upon the characteristics of the discharge event, the RC branch may turn on and then turn off before all discharge elements of transistor M1 are fully engaged, while the discharge event remains detrimental to the circuit 10. Alternatively, the pulse may not be long enough to pump up the capacitor C1 enough to reach the threshold gate potential of transistor M1 so as to turn on that transistor and thereby protect the circuit 10.

The second relatively common ESDP device of the prior art is shown in FIG. 3. In that device, the trigger is a Zener diode Z1 that essentially replaces the capacitor C1 of FIG. 2. However, the Zener diode Z1 is preferable when the delay associated with the capacitor charging is undesirable in regard to operation of the circuit 10 to be protected. The Zener diode Z1 is fabricated so as to breakdown at a voltage less than that determined to be suitable for the circuit 10. However, the protection circuit of FIG. 3 may be deficient under certain conditions. Specifically, if the circuit 10 requires a relatively low breakdown potential in order to be protected, and the process-available breakdown voltage and range of the Zener diode Z1 may simply be too high. That may be of particular concern when mixed power supplies (e.g., 5-volt nominal and 3.3-volt nominal supplies are used for coupled circuitry) are involved and multiple voltage protection levels are required. Under certain conditions, the transistor M1 may be turned off if the base drive to the effective internal parasitic lateral bipolar transistor of M1 is insufficient for bipolar action without pumping up the gate potential. Below the Zener diode Z1 breakdown voltage, current produced by Zener breakdown in diode Z1 through R1 falls and the potential at the gate of Ml drops too low to keep it on. Nevertheless, the discharge event may remain and could damage circuit 10. A trigger that fails to remain on when the ESD protection transistor M1 is on, reduces the efficiency of the protective structure and could result in premature loss of current diversion capability of M1.

Therefore, what is needed is an ESD protection circuit that may be fabricated using standard processing methods. Further, what is needed is an ESD protection circuit that remains on during the ESD event conduction process. Still further, what is needed is a triggered ESD protection circuit that may be modified to provide a selectable trigger potential so that ESD protection devices of varying threshold characteristics may be formed as part of a single integrated structure. Yet further, what is needed is a triggered ESD protection circuit that triggers fast enough to divert ESD events of the type that ordinarily occur without reliance on RC dependencies. In effect, what is needed is an ESD protection circuit having a triggering mechanism that continues to charge pump the gate of the ESD transistor throughout the ESD event and has a low on-resistance.

SUMMARY OF THE INVENTION

It is an object of the present invention to provide an ESD protection circuit that may be fabricated using standard processing methods. Further, it is an object of the present invention to provide an ESD protection circuit that remains on during the ESD event conduction process. Still further, it is an object of the present invention to provide a triggered ESD protection circuit that may be modified to provide a selectable trigger potential so that ESD protection devices of varying threshold characteristics may be formed as part of a single integrated structure. Yet further, it is an object of the present invention to provide a triggered ESD protection circuit that triggers fast enough to divert ESD events of the type that ordinarily occur without reliance on high capacitance charge pumping or on hot carrier injection. An object of the present invention is to provide an ESD protection circuit having a triggering mechanism that continues to charge pump the gate of the ESD transistor and has a low on-resistance.

These and other objectives are achieved in the present invention by way of an integrated circuit triggering mechanism coupled to the gate of a MOS ESD protection transistor. The triggering mechanism may be any sort of active device, such as a MOS transistor or a bipolar transistor, having an internal gain mechanism. The triggering mechanism has an output coupled to the gate of a conventional MOS ESD protection transistor that is, in turn, coupled in parallel with a circuit to be protected from ESD events. The triggering mechanism, whether a MOS transistor or a bipolar transistor, establishes a voltage lowering condition for the ESD transistor. Specifically, the trigger transistor is designed with a selectable breakdown voltage characteristic. That breakdown voltage must be less than the breakdown voltage of the ESD transistor such that the trigger transistor will turn on first. In addition, that breakdown voltage of the trigger transistor is designed to be more than or equal to a specified standoff voltage. The standoff voltage is the minimum potential at which the ESD protection device must be activated in order to not interfere with normal circuit operation.

While the trigger transistor includes the noted characteristics, its effectiveness is tied to the characteristics of the ESD transistor and the relationship between the two. The ESD transistor of the present invention is preferably designed to carry more current than the trigger transistor can handle. That is, once the trigger transistor sets the ESD protection device of the present invention into an activated state when the standoff voltage is exceeded at a circuit pad, the ESD transistor preferably carries most of the current associated with the ESD event. The ESD transistor is more robust than the trigger transistor to support that current once the ESD transistor is activated. The trigger transistor is the more sensitive of the two and is turned on first so as to generate a current directed to the gate of the ESD transistor. That current flowing through external resistance pumps up the ESD transistor's gate so that it turns on before the ESD event overloads the circuit to be protected. In turn, the ESD transistor, once on, ensures that the trigger transistor will not be overloaded during the ESD event by absorbing most of the current from that event. This type of ESD device is particularly advantageous when a standoff voltage is required in high speed propagation conditions, or when the ESD device cannot be conducting at potentials below the standoff voltage due to transient premature triggering. The prior RC-triggering systems fail to provide such standoff capability.

The suitable interaction of the trigger transistor and the ESD transistor may be established in a variety of ways. The trigger transistor may be formed with a conduction channel that is shorter than the conduction channel of the ESD transistor. Alternatively, the trigger transistor may be formed with transitional doping in that channel while the ESD transistor is formed without such transitional doping. That transitional doping may be the equivalent of lightly-doped drain (LDD) formation of the type that is often used in MOS transistors to minimize hot electron effects. That transitional LDD doping creates a conduction channel that is effectively narrower in the trigger transistor than it is in the ESD transistor. Of course, that results in a lower breakdown voltage characteristic of that transistor.

It is also preferable to make the trigger transistor smaller than the ESD transistor such that its on-resistance is higher than would be the case if it were sized the same as the ESD transistor while also having the transitional doping. Designing the trigger transistor in the way indicated ensures that it will be activated first by an ESD event and that it will thereby act to pump up the potential of the control node of the ESD transistor prior to the ESD event overloading the circuit to be protected. Once on, the bigger ESD transistor having a larger conduction channel and no transitional doping is capable of conducting more current than can be handled by the trigger transistor. The two transistors therefore work in a synergistic manner to produce a greatly improved ESD protection device.

In operation, the trigger transistor conducts when the potential across its high-potential node and its low-potential node exceeds the designed breakdown potential of that structure. As noted, that breakdown potential is designed into the trigger transistor to be greater than a minimum standoff potential required for standard operation of the circuit to be protected. The current through the trigger transistor is sufficient to produce a potential drop across the control node and bulk of the ESD transistor that is greater than the designed threshold potential of that transistor. It then conducts. The trigger transistor and the ESD transistor are preferably coupled together in a manner such that when both are on, the trigger transistor reduces its contribution to conduction in proportion to their respective on resistance, $R_{ON}$. At high currents, the ESD transistor is designed to have very low $R_{ON}$ and takes on most of the conduction load. If the ESD transistor is configured as a MOS transistor and the ESD event current is high enough, the ESD transistor will switch earlier from field effect operation to bipolar transistor breakdown with the aid of the trigger. When that occurs, substantially greater current can be distributed in the well (base) of the effective bipolar transistor in a way that continues to protect the circuit to be protected throughout the entirety of the ESD event.

These and other advantages of the present invention will become apparent upon review of the following detailed description, the accompanying drawings, and the appended claims.

DESCRIPTION OF THE PREFERRED EMBODIMENT

Figure 1:
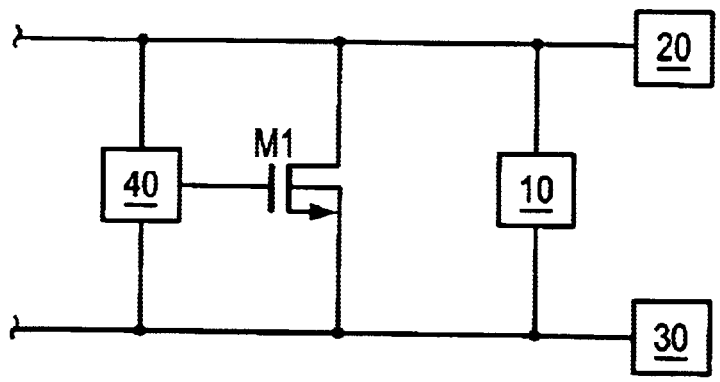
FIG. 1 is a simplified schematic block diagram of a generic ESD protection circuit of the prior art.
Figure 2:
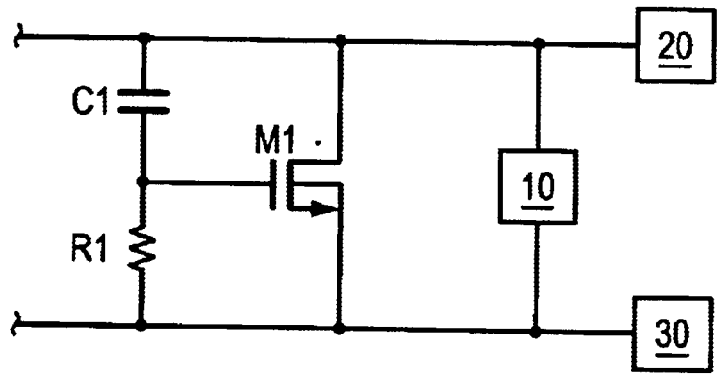
FIG. 2 is a simplified schematic diagram of an RC-triggered ESD protection circuit of the prior art.
Figure 3:
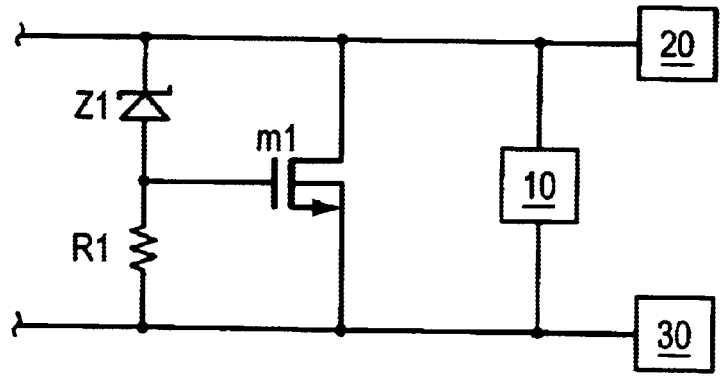
FIG. 3 is a simplified schematic diagram of a Zener diode triggered ESD protection circuit of the prior art.
Figure 4:
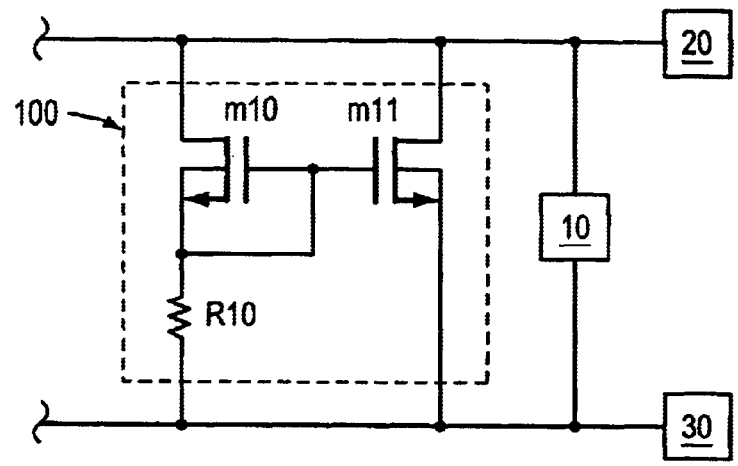
FIG. 4 is a simplified schematic diagram of the triggered ESD protection circuit of the present invention.

An ESD protection circuit 100 of the present invention is shown in FIG. 4. The circuit 100 is coupled between two potential supply pads. Without limitation and for purposes of explanation only, a first supply pad 20 will be identified as the high-potential pad and a second supply pad 30 will be identified as the low-potential pad. Either of pads 20 and 30 may experience an ESD event including, but not limited to, the human-body model type or the charged device model type. The circuit 100 is designed to protect a circuit 10 to be protected from ESD events occurring on either of pads 20 and 30. The potential at either pad beyond which the circuit 10 should not be subjected to is identified as the standoff voltage $V_{SO}$. That potential is selectable by the designer.

The ESD protection circuit 100 includes a trigger transistor M10, a resistance R10, and an ESD protection transistor M11. The trigger transistor M10 and the ESD transistor M1 are preferably NMOS transistors, as shown. However, it is to be noted that the protection circuit 100 may work as effectively using PMOS, NPN bipolar, and PNP bipolar transistors in suitable combinations as will be readily understood by those skilled in the art. The characteristics of the ESD protection circuit 100 that are of value include: 1) establishing a trigger stand-off voltage that is less than the turn-on voltage of the ESD device; 2) establishing a trigger with a gain such that its snapback voltage is below that of the ESD device and lower than the defined stand-off voltage; and/or 3) establishing an ESD device that is triggered into an ON state by gate or base pump-up voltage or current, respectively. Such a system can be used in any extended circuitry where a relatively high stand-off voltage is required for high voltage operations that are coupled to low-voltage operated circuitry, often on the same chip. The circuit 100 may be employed in high-voltage analog parts including, but not limited to, portable computers, cellular phones, and electronic games.

With continuing reference to FIG. 4, transistor M10 includes a drain coupled to pad 20 and a gate, source, and bulk coupled to the high-potential node of resistance R10. Transistor M11 includes a drain also coupled to pad 20, a gate coupled to the gate of M10 and the high-potential node of R10, and a source and bulk coupled to pad 30. Resistance R10, which may be an integral resistor but is preferably an external resistor, has a low-potential node coupled to pad 30.

Figure 5:
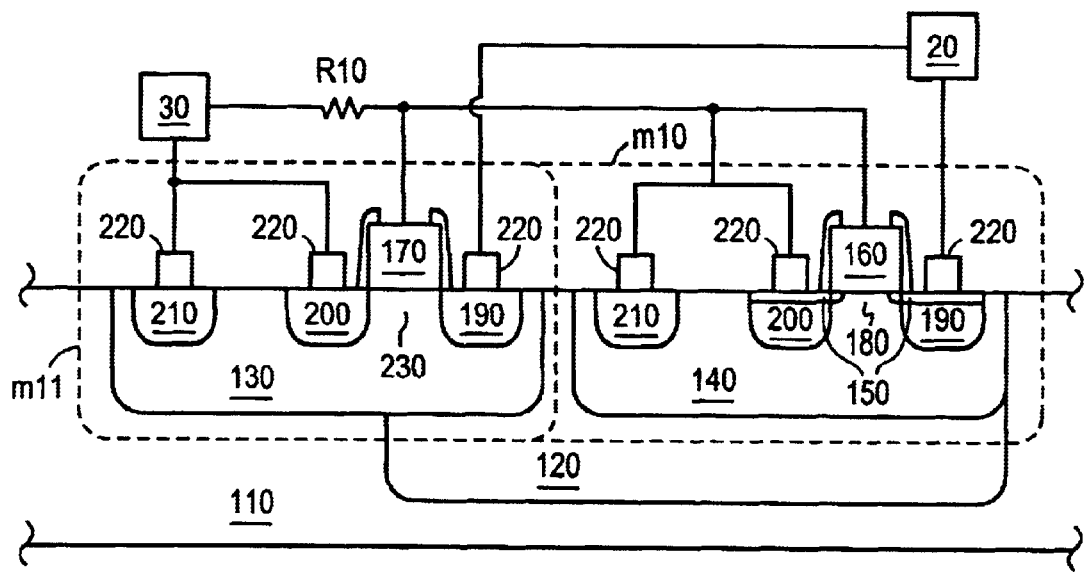
FIG. 5 is a simplified diagrammatic elevation view of the structure of the triggered ESD protection circuit shown in FIG. 4.

The preferred structure of the protection circuit 100 is shown in FIG. 5. That structure may be fabricated using conventional semiconductor processing masks and steps. It may be fabricated as a stand-alone structure or integrally with the formation of the circuit 10. The compound transistor structure of the circuit 100 shown in FIG. 5 includes a substrate 110 of P-type semiconductor material. A low-doped N-type region 120 is formed in a portion of the substrate 110. One PWell 130 is shorted to the substrate 110 and another PWell 140 is isolated from the substrate 110 and, hence, from the other PWell 130 by placing it substantially wholly inside of the area defined by region 120. These are the PWells in the regions associated with the ESD transistor M11 and the trigger transistor M10, respectively.

In a preferable design of the trigger transistor M10, an LDD region 150 is established at the surface of the active area of PWell 140 by introducing N-type dopant into the self-aligned area surrounding a trigger gate 160 formed on the surface of PWell 140. It is to be noted that ESD transistor gate 170 is also typically formed during the formation of trigger gate 160. The LDD region 150 minimizes hot electron effects. More importantly for the present invention, it reduces the effective length of gate channel 180 and sets the source-to-drain breakdown potential $V_{bkt}$ of trigger transistor M10. In particular, $V_{bkt}$ is dependent upon dopant concentration in region 150. The remaining significant steps in the process of fabricating the circuit 100 of the present invention include formation of the respective drain regions 190 and source regions 200 of the two transistors by doping with N-type dopant at carrier concentrations greater than those used to form the LDD region 150. Additionally, introducing P-type dopants in suitable concentrations into the PWells 130 and 140 forms connections to the transistor bulk regions 210. Finally, contacts 220 are established to couple respective active regions to external components including, but not limited to, pads 20 and 30 and resistance R10. It can be seen in FIG. 5 that, unlike for trigger transistor M10, ESD transistor M11 has an ESD gate channel 230 length that is defined by the spacing of the drain and source regions 190 and 200 rather than by LDD regions 150. Transistor M11 is therefore designed to have a higher source-to-drain breakdown potential $V_{bke}$ greater than $V_{bkt}$. Of course, that same relationship may be achieved by reducing the spacing between the drain 190 and source 200 regions of transistor M10 in comparison to corresponding spacing for those regions for transistor M11. Although the structures of transistors M10 and M11 shown in FIG. 5 appear to be substantially equivalent in size, it is to be noted that ESD protection transistor M11 is preferably larger than trigger transistor M10 in order to accommodate larger ESD event conduction currents.

In operation, transistor M10 is activated when the potential at either of pads 20 and 30 exceeds $V_{bkt}$ (which is designed to be higher than $V_{so}$). The current through M10 produces a voltage drop across R10 between the gate 170 and the bulk region 210 of transistor M11 that exceeds the threshold potential of that transistor, thereby turning it on. Transistor M11 conducts in FET mode at that stage. At the same time, since transistor M10 has its gate 160, its PWell 210, and its source 200 all tied together, it cannot operate in FET mode. As transistor M11 conducts in FET mode, the voltage from the drain 190 to the source 200 of transistor M10 drops below $V_{bkt}$ but M10 never stops conducting because its snapback voltage, $V_{sbt}$, is lower than the snapback voltage, $V_{sbe}$, of transistor M11, while M11 remains on so long as the ESD event generates a potential that exceeds $V_{sbt}$. Through this arrangement, transistor M10 will not be destroyed by ESD event currents that are too high for it to support. If the current associated with the ESD event is sufficiently high for the particular characteristics of M11, that transistor will transition into lateral NPN bipolar transistor operation and will therefore be able to distribute current through its much larger effective collector region than is present in FET mode. It can thereby sustain significant current diversion prior to thermal degradation.

The circuit 100 of the present invention is particularly advantageous in that it provides an internal gain mechanism that lowers the clamping voltage of the trigger device that heretofore was not available for similar devices. The circuit 100 provides no in-line resistance to internal circuitry and can therefore be used without performance degradation for input and output ESD events. Among other reasons, its advantage lies in the fact that it provides a modification of the snapback voltage event that occurs. This modification ensures that the trigger transistor M10 will not turn off when snapback associated with the turning on of transistor M11 occurs. Instead, the trigger transistor m10 continues to share in inverse proportion to its size in the conduction of current with ESD transistor M11. It thereby continues to pump up the gate voltage for M11 through snapback so as to ensure uniform turn on of that structure, including when it is established with a plurality of gate fingers, as is common for ESD structures.

While the invention has been described with reference to particular example embodiments, it is intended to cover all modifications and equivalents within the scope of the following claims.

What is claimed is:

1. An ESD circuit for protecting a second circuit having a specified stand-off voltage, wherein both circuits are coupled between a first supply pad and a second supply pad, the ESD protection circuit comprising:

an ESD protection transistor coupled between the first supply pad and the second supply pad, wherein said ESD protection transistor includes art input and is designed with a breakdown potential and a threshold turn-on potential; and a trigger transistor with a first coupled to the first supply pad a gate, a source, and bulk regions connected together defining an output, the output connected to the ESD protection transistor's input, a resistance connecting the output to the second supply pad, wherein said trigger transistor is designed with an effective channel length smaller than an effective channel length of said protection transistor, and said trigger transistor is designed with a breakdown potential closer to the stand-off potential than is said breakdown potential of said ESD protection transistor, and wherein said trigger MOS transistor activates said ESD protection transistor when said output reaches said threshold turn-on potential.

2. The ESD protection device as claimed in claim 1 wherein said drain region and said source region of said trigger transistor each includes an LDD region.

3. The ESD protection device as claimed in claim 1 wherein said protection transistor is designed to carry more current than said trigger transistor.

4. An ESD protection device for protecting a circuit form ESD events between a first supply pad and a second supply pad to which the circuit is connected, wherein the circuit is designed with a stand-off voltage, the ESD protection device comprising:

an ESD protection NMOS transistor having a drain coupled to the first supply pad and as source and a bulk region coupled to the second supply pad, said ESD protection NMOS transistor having a source-to-drain breakdown potential;

a trigger NMOS transistor having a drain coupled to the first supply pad, said trigger NMOS transistor having and a source-to-drain breakdown potential higher than the stand-off voltage and less that said source-to-drain breakdown potential of said ESD protection NMOS transistor; and a resistor having a low-potential node coupled to the second supply pad and a high potential node coupled to a gate of said ESD protection NMOS transistor and to a gate, source, and bulk region of said trigger NMOS transistor, wherein said trigger NMOS transistor has an effective gate channel length less than an effective gate channel length of said ESD protection NMOS transistor.

5. The ESD protections device of claim 4 wherein said trigger NMOS transistor includes LDD regions formed in said drain and said source of said trigger NMOS transistor.

6. A process for fabricating an ESD protection circuit formed of a compound transistor structure including an ESD protection transistor and a trigger transistor, the process comprising the steps of:

forming an isolation layer of semiconductor material of a first conductivity on a semiconductor substrate;

forming a first well of semiconductor material of second conductivity type in said semiconductor substrate;

forming a second well of semiconductor material of second conductivity type in said isolation layer and spaced from said first well by said isolation layer;

forming source and drain regions of semiconductor material of first conductivity type in said first well and said second well, wherein source and drain regions of said first well are spaced farther apart than said source and drain regions of said second well; and forming a first region of semiconductor material of second conductivity type in high enough concentration to form a connection to said first well, and a second region of semiconductor material of second conductivity type in high enough concentration to form a connection to said second well;

forming gate for the transistor in said first and in said second wells connecting the source, well and gate of the transistor in the second well to the gate of the transistor in the first well, forming a resistance located outside of the fit well, and connecting the resistance from the gates of both transistors to a second supply pad and the drains of both transistors to a first supply pad, wherein the breakdown of the transistor in the second well is less than the breakdown of the transistor in the first well, where the snap-back voltage of the transistor in the second well is less that the snap back voltage of the transistor in the first well.

7. The process as claimed in claim 6 further comprising the step of forming a surface of said second will LDD regions of semiconductor material of first conductivity type prior to forming said source and drain regions in said second well.

8. The process as claimed in claim 6 wherein said first well, and said source region, said drain region, and said bulk region in said first well are larger than said respective second well, and said source region, said drain region, and said, bulk region in said second well.

9. The process of claim 6 wherein the step of forming an isolation layer is replace by the step of obtaining a semiconductor substrate of a first conductivity.

10. An ESD protection circuit formed of a compound transistor structure including an ESD protection transistor and a trigger transistor, the ESD protection circuit comprising:

an isolation layer of semiconductor material of a first conductivity on a semiconductor substrate;

a first well of semiconductor material of second conductivity type in said semiconductor substrate;

a second well of semiconductor material in said isolation layer and spaced from said first well;

source and drain regions of semiconductor material of first conductivity type in said first well and said second well, wherein source and drain regions of said first well are spaced farther apart than said source and drain regions of said second well;

a first region of semiconductor material of second conductivity type in high enough concentration to form a connection to said first well, and a second region of semiconductor material of second conductivity type in high enough concentration to form a connection to said second well;

a gate for the transistor in said first and in said second wells the source, well and gate of the transistor in the second well to the gate of the transistor in the first well, a resistance located outside of the first well, wherein the resistance connects from the gates of both transistors to a second supply pad and the drains of both transistors are connected to a first supply pad, wherein the breakdown of the transistor in the second well is less than the breakdown of the transistor in the first well, wherein the snapback voltage of the transistor in the second well is less that the snap back voltage of the transistor in the first well.

11. The ESD protection circuit of claim 10 wherein the wherein the isolation layer of semiconductor material of a first conductivity on a semiconductor substrate is replaced by a semiconductor substrate of a first conductivity.

* * * * *